US011279210B2

(12) United States Patent
Kim

(10) Patent No.: US 11,279,210 B2
(45) Date of Patent: Mar. 22, 2022

(54) ROOF RACK ASSEMBLY AND HOOD LIGHT-BLOCKING FABRIC ASSEMBLY THAT ARE CAPABLE OF PHOTOVOLTAIC GENERATION

(71) Applicant: SOLARSALT., CO.LTD, Gyeonggi-do (KR)

(72) Inventor: Sang Wook Kim, Gyeonggi-do (KR)

(73) Assignee: SOLARSALT., CO.LTD, Gyeonggi-do (KR)

( * ) Notice: Subject to any disclaimer, the term of this patent is extended or adjusted under 35 U.S.C. 154(b) by 0 days.

(21) Appl. No.: 17/023,593

(22) Filed: Sep. 17, 2020

(65) Prior Publication Data

US 2021/0006199 A1 Jan. 7, 2021

Related U.S. Application Data

(62) Division of application No. 16/301,950, filed as application No. PCT/KR2017/005592 on May 29, 2017, now Pat. No. 10,819,272.

(30) Foreign Application Priority Data

Jun. 1, 2016 (KR) .................. 10-2016-0068145
Jun. 14, 2016 (KR) .................. 10-2016-0074032
Apr. 12, 2017 (KR) .................. 10-2017-0047166

(51) Int. Cl.
*B60J 3/02* (2006.01)
*H02S 20/30* (2014.01)
(Continued)

(52) U.S. Cl.
CPC .................. *B60J 3/002* (2013.01); *B60J 3/02* (2013.01); *B60R 9/00* (2013.01); *B60R 9/045* (2013.01);
(Continued)

(58) Field of Classification Search
CPC .............. B60J 3/002; H02S 2/30; H02S 30/20
(Continued)

(56) References Cited

U.S. PATENT DOCUMENTS 7,156,452 B2 * 1/2007 Schumacher ........ B62D 35/005
296/180.1
2010/0000592 A1 1/2010 Ko

FOREIGN PATENT DOCUMENTS

CN 2763118 3/2006
CN 101309809 A * 11/2008 ................ H02J 7/35
(Continued)

OTHER PUBLICATIONS

International Search Report dated Sep. 11, 2017 for PCT/KR2017/005592.

*Primary Examiner* — Dennis H Pedder

(57) ABSTRACT

The present invention relates to a roof rack assembly and a hood light-blocking fabric assembly, the hood light-blocking fabric assembly capable of photovoltaic generation comprising: a lower photovoltaic generation plate fixedly installed to cover the hood of a vehicle and configured to prevent inflow of heat energy of sunlight into the vehicle, to absorb sunlight, and to produce electricity accordingly; and an upper photovoltaic generation plate installed on an upper portion of the lower photovoltaic generation plate and configured to change between a first position at which the upper photovoltaic generation plate overlaps the upper portion of the lower photovoltaic generation plate and a second position at which the upper photovoltaic generation plate covers a front glass of the vehicle.

11 Claims, 12 Drawing Sheets

(51) Int. Cl.
| | |
|---|---|
| *B60J 3/00* | (2006.01) |
| *B60R 9/045* | (2006.01) |
| *H02S 30/20* | (2014.01) |
| *H05K 7/18* | (2006.01) |
| *H02S 40/36* | (2014.01) |
| *B60R 9/00* | (2006.01) |
| *G02B 5/00* | (2006.01) |
| *H02S 20/20* | (2014.01) |
| *H02S 40/38* | (2014.01) |

(52) U.S. Cl.
CPC .............. *G02B 5/003* (2013.01); *H02S 20/30* (2014.12); *H02S 30/20* (2014.12); *H02S 40/36* (2014.12); *H05K 7/18* (2013.01); *H02S 20/20* (2014.12); *H02S 40/38* (2014.12)

(58) Field of Classification Search
USPC .............. 296/211, 95.1, 91, 136.05–136.08, 296/136.13; 136/291
See application file for complete search history.

(56) References Cited

FOREIGN PATENT DOCUMENTS

| | | |
|---|---|---|
| JP | 2004-311502 | 12/2005 |
| KR | 10-2002-0010331 | 2/2002 |
| KR | 10-2013-0078896 | 7/2013 |
| KR | 10-1284765 | 7/2013 |
| KR | 20-2016-0001839 | 5/2016 |

\* cited by examiner (a)

(b)

ROOF RACK ASSEMBLY AND HOOD LIGHT-BLOCKING FABRIC ASSEMBLY THAT ARE CAPABLE OF PHOTOVOLTAIC GENERATION

CROSS REFERENCES TO RELATED APPLICATIONS

This application is a divisional of Sang Wook Kim, U.S. patent application Ser. No. 16/301,950 filed on Nov. 15, 2018, entitled "ROOF RACK ASSEMBLY AND HOOD LIGHT-BLOCKING FABRIC ASSEMBLY THAT ARE CAPABLE OF PHOTOVOLTAIC GENERATION", which claims the priority of Korean Patent Application Nos. 10-2016-0068145, filed on Jun. 1, 2016, 10-2016-0074032, filed on Jun. 14, 2016, and 10-2017-0047166, filed on Apr. 12, 2017 in the KIPO (Korean Intellectual Property Office), the disclosure of which is incorporated herein entirely by reference. Further, this application is the National Stage application of International Application No. PCT/KR2017/005592, filed on May 29, 2017, which designates the United States and was published in Korean. Each of these applications is hereby incorporated by reference in their entirety into the present application.

TECHNICAL FIELD

The present disclosure relates to a roof rack assembly and a hood light-blocking fabric assembly that are capable of photovoltaic generation, and more specifically, to a roof rack assembly having a plurality of photovoltaic generation light-blocking plates which are capable of the photovoltaic generation and which are automatically folded up or unfolded to block direct sunlight from entering the vehicle through a roof, and to a hood light-shielding assembly capable of photovoltaic generation with photovoltaic generation plates installed to cover a hood of the vehicle to generate electricity using sunlight, as well as blocking inflow of sunlight from entering the vehicle through the hood.

BACKGROUND ART

Generally, trunk of an automobile is used when carrying cargo on the automobile. Recently, a roof rack has also been used to carry cargoes of volume or length that are too large to be accommodated in the trunk space. The roof rack is fixed on an upper surface of the roof of the vehicle and mounted with roof bags or the like in which ski equipment or camping equipment is loaded.

An example of a roof rack is disclosed in Korean Patent No. 10-1284765 entitled "Integrated roof rack for vehicle and method of manufacturing the same".

However, since the related art roof rack such as that disclosed in KR Patent No. 10-1284765 is used only for loading cargoes, there is a limitation in that the utilization of the roof rack is low for users who carry cargoes less frequently.

Meanwhile, recently, with the five-day workweek being prevalent, increased number of people now spend their leisure time with their families on weekends. Therefore, increased population use their vehicles to go traveling, camping, and so on. As people have to stay inside the vehicles for the extended time, use of various types of convenience equipment to provide more comfortable time in the vehicle is increased.

Particularly, the use of the light blocking equipment to block the entry of sunlight into the front and rear seats is increased. Curtains, blinds, adhesive light-blocking plates, and the like are used. However, the light blocking equipment described above merely blocks sunlight from entering through the side window of the vehicle, and there is actually no equipment available to block sunlight from entering through the roof of the vehicle and block sunlight from entering through the hood (or bonnet) or the front windshield of the vehicle, causing difficulty of keeping the inside temperature of the vehicle from rising while the vehicle is parked.

Particularly in summer, since the temperature of the vehicle rises rapidly within a short time, even when the driver gets back to his or her car after a brief stop, it is very uncomfortable to get in the car for such a high temperature inside the vehicle. In this case, even after turning on air conditioner, the room temperature is not quickly lowered, and the driver has to sit in the hot car until the temperature drops.

In addition, the increased temperature inside the vehicle during vehicle stop also means a risk that the products such as lighters, aerosols and the like equipped in the vehicle are exposed to the danger of fire.

When the sunlight is transmitted through the roof of the vehicle of the metal material, there is a problem that a large amount of heat flows into the interior of the vehicle, and the indoor temperature rises even when the air conditioner is operated.

Therefore, there is a need for a means to fundamentally block the heat entering the interior of the vehicle through the roof of the vehicle.

Meanwhile, in recent years, various types of electronic devices are mounted and used on the vehicle. A plurality of devices including navigation, black box, car fan, and the like are mounted and used as circumstances require. Since these electronic devices increase the consumption of the battery of the vehicle, the battery of the vehicle is discharged in some cases.

When the battery of the vehicle is discharged, it is necessary to call for someone from service center to charge the battery, which can be cumbersome in that the vehicle cannot be moved during the charging.

DISCLOSURE OF THE INVENTION

Technical Problem

In order to solve the problems mentioned above, the present disclosure has been made in view of the background art described above, and it is an object of the present invention to provide a roof rack assembly having a photovoltaic generation light-blocking plate that is capable of blocking the heat entering the interior of a vehicle through a roof of the vehicle.

Another object of the present disclosure is to provide a roof rack assembly in which a roof rack, which has been used only for load-carrying purposes, can also be used for a purpose of supporting a photovoltaic generation light-blocking plate.

Yet another object of the present disclosure is to provide a roof rack assembly in which a photovoltaic generation light-blocking plate can absorb sunlight to generate electric energy.

Yet another object of the present disclosure is to provide a roof rack assembly capable of preventing electric discharge of a vehicle battery by converting the electric energy generated from a photovoltaic generation light-blocking plate for use in the battery inside a vehicle.

The present disclosure has been made in view of the problems in background art described above, and an object of the present disclosure to provide a hood light-blocking fabric assembly capable of photovoltaic generation, which is provided with a photovoltaic generation plate to cover a hood of a vehicle, thereby preventing the heat of sunlight from entering the interior of the vehicle, while also producing electric energy by absorbing inflow of sunlight into the vehicle.

In addition, another object of the present disclosure to provide a hood light-blocking fabric assembly capable of photovoltaic generation and having an improved shape, which is positioned to cover a hood of a vehicle when the vehicle is traveling and deformed during stop to cover both the hood and a front glass, thus enabling photovoltaic generation from an area corresponding to a hood area of the vehicle when the vehicle is traveling, while blocking the hood at the same time, and enabling photovoltaic generation from an area corresponding to the hood and the front glass when the vehicle is stopped, while blocking the hood at the same time.

The above objects and various advantages of the present disclosure will become more apparent from the preferred embodiments of the present disclosure by those skilled in the art.

Technical Solution

According to an aspect of the present disclosure, there is provided a roof rack assembly, which may include a pair of roof racks coupled to the roof of a vehicle; a photovoltaic generation light-blocking module coupled to be able to move forward/backward along the pair of roof racks and configured to expose/cover the roof and to block sunlight; a light-blocking plate transfer portion for applying a driving force such that the photovoltaic generation light-blocking module moves forward/backward along the pair of roof racks and is unfolded over the roof of the vehicle or is folded; a converter for converting electric energy generated by the photovoltaic generation light-blocking module into power that can be used by the light-blocking plate transfer plate and the vehicle; an accumulator for storing power converted by the converter; and a controller for controlling supply of power by the converter and the accumulator.

According to an embodiment of the present disclosure, the photovoltaic generation light-blocking module may further include a photovoltaic generation light-blocking plate which is moved between the pair of roof racks; and a fixing plate fixed to the roof racks to support the photovoltaic generation light-blocking plate so that the photovoltaic generation light-blocking plate is slidably moved.

According to an embodiment of the present disclosure, the light-blocking plate transfer portion may further include a transfer motor that provides a rotational force to allow the photovoltaic generation light-blocking plate to move slidably from the fixing plate; a transfer roller that guides the sliding movement of the photovoltaic generation light-blocking plate, while moving along upper surfaces of the roof racks; an opening and closing shaft coupled to a front portion of the fixing plate and connected to the transfer motor to be rotated bi-directionally; and a plurality of wire members, one end of which is fixed to the photovoltaic generation light-blocking plate and the other end of which is fixed to the opening and closing shaft to transfer the photovoltaic generation light-blocking plate according to a direction of rotation of the opening and closing shaft.

According to an embodiment of the present disclosure, the opening and closing shaft may include a first winding portion around or from which a first wire of the plurality of wire members is wound and unwound, and a second winding portion inside the first winding portion, around or from which a second wire of the plurality of wire members is wound and unwound, and when the first wire is wound around the first winding portion, the second wire may be unwound from the second winding portion.

According to an embodiment of the present disclosure, the roof racks may include guide protrusions protruding upward from upper surfaces to guide a movement of the transfer roller.

According to an embodiment of the present disclosure, the plurality of photovoltaic generation light-blocking plates may include: a fixing plate fixedly coupled to rear ends of the pair of roof racks; a moving plate coupled to a leading end of the fixing plate; and a traction plate provided in front of the moving plate to be moved along the roof racks by a driving force of the light-blocking plate transfer portion to pull the moving plate, in which a transfer projection may be protruded from a bottom surface of the traction plate and the moving plate, and a protrusion insertion groove may be formed on an upper surface of the moving plate and the fixing plate to receive the transfer projection to be inserted and slidably moved therein.

According to an embodiment of the present disclosure, a rack gear may be formed on upper surfaces of the roof racks along a longitudinal direction, and the light-blocking plate transfer portion may include: a transfer gear disposed to be engaged with the rack gear; a gear housing coupled to the roof racks to be moved therealong, and supported by the transfer gear to be rotated, wherein an upper end of the gear housing is coupled to a lower portion of the traction plate; and a driving motor fixedly coupled to a lower portion of the traction plate to transfer a driving force to the transfer gear.

In addition, in order to achieve the above-mentioned object, a hood light-blocking fabric assembly capable of photovoltaic generation is provided, which may include: a lower photovoltaic generation plate fixedly installed to cover the hood of the vehicle and configured to prevent inflow of heat energy of sunlight into the vehicle, to absorb sunlight, and to produce electricity accordingly; and an upper photovoltaic generation plate installed on an upper portion of the lower photovoltaic generation plate and configured to change between a first position at which the upper photovoltaic generation plate overlaps the upper portion of the lower photovoltaic generation plate and a second position at which the upper photovoltaic generation plate covers a front glass of the vehicle.

The hood light-blocking fabric assembly capable of photovoltaic generation may further include: a transfer/tilting unit for moving the upper photovoltaic generation plate forward/backward with regard to the lower photovoltaic generation plate and rotating the same upward/downward by a predetermined angle such that the upper photovoltaic generation plate can be positioned at the first location or at the second location; a first driving portion for providing a driving force such that the upper photovoltaic generation plate is moved forward/backward with regard to the lower photovoltaic generation plate; and a second driving portion for providing a driving force such that the upper photovoltaic generation plate is tilted with regard to the lower photovoltaic generation plate by a predetermined angle.

The transfer/tilting unit may include: a rail unit installed on the lower photovoltaic generation plate in a forward/backward direction; a forward/backward moving member to be moved along the rail unit; and an upward/downward pivot member installed to be rotatable by a predetermined angle with respect to the forward/backward moving member and having the upper photovoltaic generation plate installed at an upper end thereof.

The first driving portion may include: a rotation bar rotatably installed on the lower photovoltaic generation plate and including a thread formed on an outer circumferential surface thereof; an electric motor that rotates the rotation bar; and an activating member, one end of which is fixed to the forward/backward moving member and the other end of which is coupled to the rotation bar in a ball-screw form, to move the forward/backward moving member in the forward/backward direction while moving along the rotation bar in accordance with rotation of the rotation bar.

The second driving portion may include: an electric cylinder unit installed to connect the forward/backward moving member to the upward/downward pivot member, to pivot the upward/downward movable member with respect to the forward/backward moving member by a predetermined angle in accordance with a stretching operation.

Further, a third driving portion may be provided, which is installed to connect the upward/downward moving member to the upper photovoltaic generation plate to rotate the photovoltaic generation plate with respect to the upper moving member.

Further, an air guide plate may be provided, which is installed at a front portion of the lower photovoltaic generation plate to prevent air resistance of the upper photovoltaic generation plate when the vehicle is traveling.

Advantageous Effects

The present disclosure gives the following effects. According to some embodiments of the present disclosure, the roof racks can be used for transferring the photovoltaic generation light-blocking plate as well as loading cargoes. A plurality of photovoltaic generation light-blocking plates, stacked on the rear end of the roof rack and overlapping one another, are automatically spread over the roof of the vehicle, thereby blocking inflow of direct sunlight into the interior of the vehicle. As a result, the increase of the room temperature inside the vehicle is lowered to some degree, so that the fuel and electricity consumption of the vehicle can be reduced.

According to some embodiments of the present disclosure, a plurality of photovoltaic generation light-blocking plates absorb sunlight while being spread on the roof of the vehicle to generate electric energy. The generated electric energy can be stored in the accumulator to be used for transferring the photovoltaic generation light-blocking plate, or for driving the devices used in the vehicle, and can also be used as an emergency power source during outdoor activities.

As described above, the photovoltaic generation plate covers the hood to prevent inflow of the heat energy of the sunlight into the interior of the vehicle, thereby reducing the rise in room temperature, and as a result, fuel consumption of the vehicle can be reduced. In addition, there is an effect that it is possible not only to prevent an increase in the room temperature, but also to use the electricity generated from the photovoltaic generation through the photovoltaic generation plate to drive the devices used inside the vehicle or to use as power source of other electronic device.

In addition, the present disclosure has the effect that the photovoltaic generation plate is transformed when the vehicle is stopped so that the lower photovoltaic generation plate covers the hood and the upper photovoltaic generation plate covers the front glass, thus increasing not only the effect suppressing the temperature rise inside the vehicle, but also the amount of electric power generation with the increased area of the photovoltaic generation.

MODE FOR CARRYING OUT THE INVENTION

Figure 1:
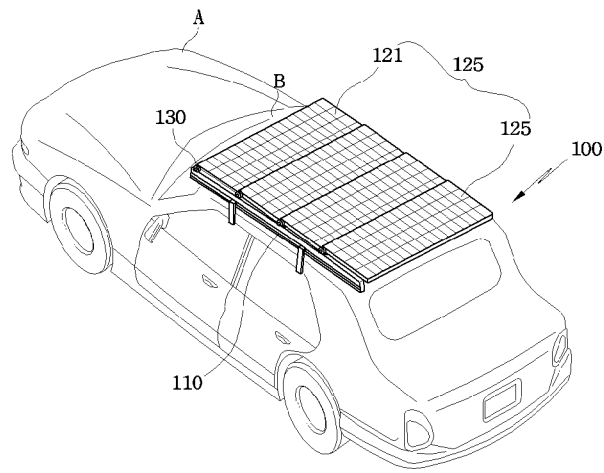
FIG. 1 is a view showing a state where a roof rack assembly is installed in a vehicle according to a first embodiment of the present disclosure.

Hereinafter, preferred embodiments of the present disclosure will be described in detail with reference to the accompanying drawings. It should be noted that, in adding reference numerals to the constituent elements of the drawings, the same constituent elements are denoted by the same reference numerals even if they are illustrated in different drawings. In the following description of the present disclosure, a detailed description of known functions and configurations incorporated herein will be omitted when it may make the subject matter of the present disclosure rather unclear.

Further, in describing the elements of the present disclosure, the terms such as "first," "second,", "A," "B," "(a)," "(b)" and so on may be used. However, these terms are used solely for the purpose of distinguishing one element from another, and the terms do not limit the nature, sequence or order of the corresponding elements. When a certain element is stated as being "connected" or "coupled" with another element, it is to be understood that there may be another intervening element "connected" or "coupled therebetween, although the elements may also be directly connected or coupled with each other.

Figure 2:
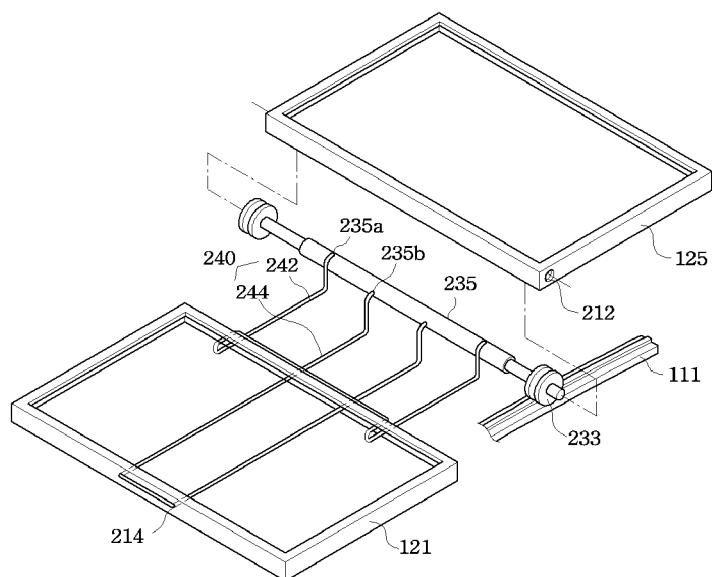
FIG. 2 is an exploded perspective view showing a frame structure of a roof rack assembly according to the first embodiment of the present disclosure.
Figure 3:
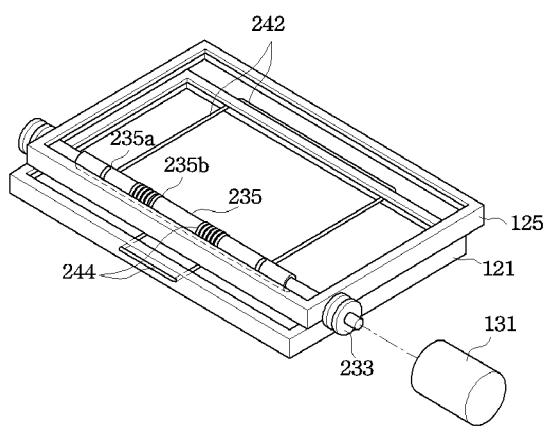
FIGS. 3 to 5 are views showing a process of unfolding a roof rack assembly according to a first embodiment of the present disclosure.
Figure 4:
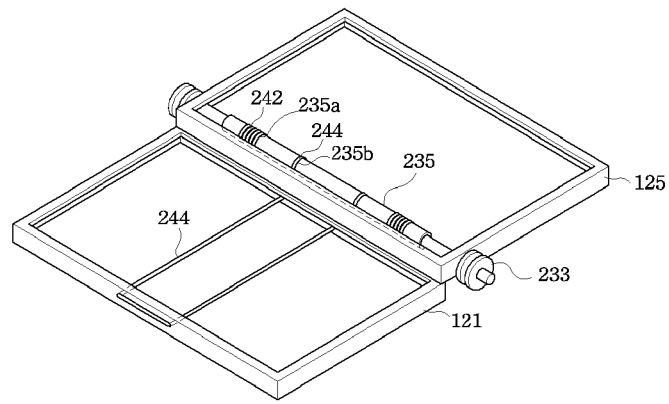
Figure 5:
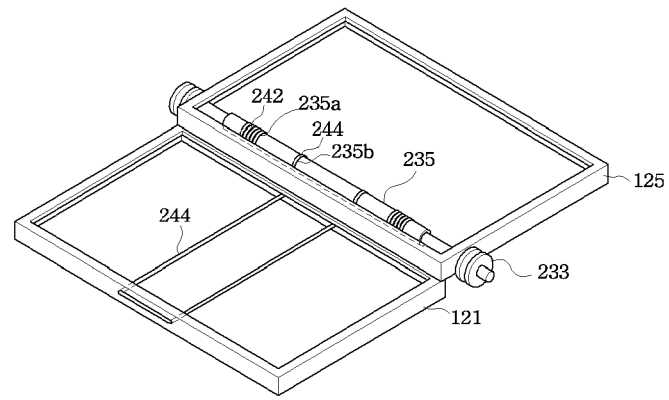

FIG. 1 is a view showing a state where a roof rack assembly is installed in a vehicle according to a first embodiment of the present disclosure, FIG. 2 is an exploded perspective view showing a frame structure of a roof rack assembly according to the first embodiment of the present disclosure, and FIGS. 3 to 5 are views showing a process of unfolding a roof rack assembly according to a first embodiment of the present disclosure.

As illustrated, a roof rack assembly 100 according to the first embodiment of the present disclosure includes a pair of roof racks 110 mounted on a roof B of a vehicle A, a photovoltaic generation light-blocking module 120 moved along the roof racks 110 to be unfolded, to block direct sunlight from entering the roof of the vehicle and to absorb sunlight to generate electric energy, and a light-blocking plate transfer portion 130 that generates a driving force to allow the photovoltaic generation light-blocking plate 121 of the photovoltaic generation light-blocking module 120 to be moved along the roof racks 110.

While a passenger car is illustrated as an example of the vehicle A having the roof rack assembly 100 installed thereon according to the preferred embodiment of the present disclosure, this is merely an example, and accordingly, the roof rack assembly 110 may be installed on an upper portion of the SUV.

A pair of roof racks 110 are configured on both sides of the roof B, respectively, and fixedly coupled to the roof B of the vehicle A.

The roof racks 110 includes rack bodies 111 that guide the movement of a transfer roller 233 of the light-blocking plate transfer portion 130. The rack bodies 111 may be disposed integrally on both sides of the roof B, but not limited thereto.

The rack bodies 111 may have guide protrusions 211 protruding upward to guide the movement of the transfer roller 233 of the light-blocking plate transfer portion 130. Various forms of the guide protrusion 211 may be realized according to how the rack bodies 111 and the light-blocking plate transfer portion 130 are coupled with each other.

For example, when the rack bodies 111 and the light-blocking plate transfer portion 130 are coupled by the gears, the guide protrusion 211 may be configured with a rack gear 111b, as illustrated in the second embodiment of the present disclosure.

The photovoltaic generation light-blocking module 120 is a component that is movably provided between the pair of roof racks 110 to block sunlight from being directly shone on the roof B of the vehicle and to absorb sunlight for the purpose of generating electric energy, and includes a photovoltaic generation light-blocking plate 121 that is moved between roof racks 110, and a fixing plate 125 that is disposed at a rear-most end of the vehicle with respect to the driver's seat of the vehicle and fixed to the rack bodies 111 of the roof rack 110.

The fixing plate 125 is fixedly coupled to the rack bodies 111 at both ends thereof and includes a shaft coupling hole 212 into which an opening and closing shaft 235 of the light-blocking plate transfer portion 130 is rotatably coupled.

In addition, the photovoltaic generation light-blocking plate 121 includes a plurality of wire members 240 which are connected to the opening and closing shaft 235 to move the photovoltaic generation light-blocking plate 121 to be opened at the roof B of the vehicle A or closed on the roof B in accordance with a direction of rotation of the opening and closing shaft 235.

At this time, wire fixing holes 214 are formed in the center of the front and rear portions of the photovoltaic generation light-blocking plate 121, respectively, so that one ends of the plurality of wire members 240 are inserted and passed therethrough and fixed in position.

Figure 22:
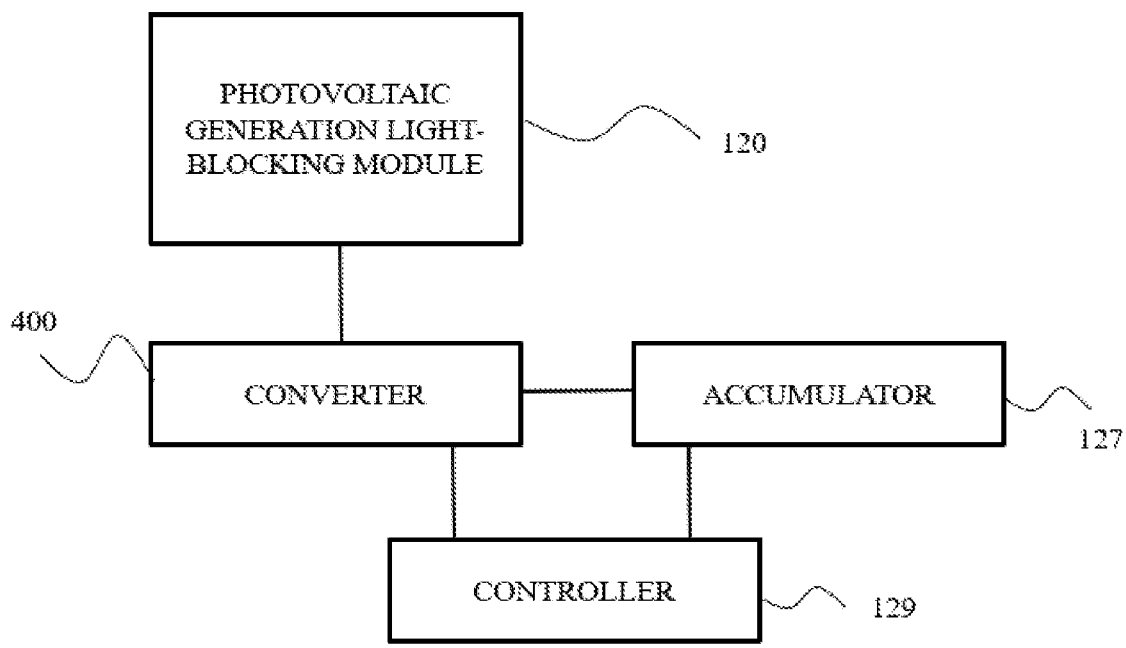
FIG. 22 is a block diagram showing electrical components of the present invention.

Of course as shown in FIG. 22, the photovoltaic generation light-blocking module 120 according to the present disclosure may further include an accumulator 127 that stores electric energy generated from the photovoltaic generation light-blocking plate 121, a converter 400 for converting the electric energy generated from the photovoltaic generation light-blocking plate 121 into a power for use in the vehicle, and a controller 129 that includes a control circuit for controlling supply of power of the converter 400 and the accumulator 127.

The light-blocking plate transfer portion 130 includes a transfer motor 131 that provides a rotational force to allow the photovoltaic generation light-blocking plate 121 to move slidably from the fixing plate 125, a transfer roller 233 for guiding the sliding movement of the photovoltaic generation light-blocking plate 121 while moving along the upper surfaces of the rack bodies 111, an opening and closing shaft 235 coupled to a front portion of the fixing plate 125 and connected to the transfer motor 131 for bidirectional rotation, and a plurality of wire member (240) fixed to the photovoltaic generation light-blocking plate 121 at one ends, and fixed to the opening and closing shaft 235 at the other ends, to transfer the photovoltaic generation light-blocking plate 121 in accordance with a direction of rotation of the opening and closing shaft 235 to expose or shield the roof B of the vehicle A.

The opening and closing shaft 235 is a component that is connected to the transfer motor 131 included in the light-blocking plate transfer portion 130 to perform a rotary operation, which in turn causes the photovoltaic generation light-blocking plate 121 to be slidably moved. The other end of the first wire 242 of the plurality of wire members 240 is fixed to the opening and closing shaft 235, and the opening and closing shaft 235 includes a first winding portion 235a onto or from which the first wire 242 is wound and unwound, and a second winding portion 235b onto or from which the second wire 244 is wound or unwound.

At this time, the first and second winding portions 235a and 235b may further include certain fixing grooves into which end portions of the first and second wires 242 and 244 are inserted and fixed, but not limited thereto.

The first winding portion 235a is formed on an outer side of the opening and closing shaft 235, and the second winding portion 235b is formed on a center side of the opening and closing shaft 235b to prevent twisting when the plurality of wire members 240 are wound and unwound.

In addition, the plurality of wire members 240 include a first wire 242 having both ends fixed to the first winding portion 235a of the opening and closing shaft 235 and to a rear side frame of the photovoltaic generation light-blocking plate 121, respectively, and a second wire 244 having both ends fixed to the second winding portion 235b and to a front side frame of the photovoltaic generation light-blocking plate 121.

The plurality of wire members 240 are configured such that the first wire 242 and the second wire 244 are wound or unwound in direction opposite to each other in accordance with a direction of rotation of the opening and closing shaft 235.

That is, when the first wire 242 is unwound, the second wire 244 is wound around the second winding portion 235b. On the other hand, when the second wire 244 is unwound, the first wire 242 is wound around the first winding portion 235a.

The roof rack assembly 100 having the configuration described above according to the present disclosure includes a pair of rack bodies 111 installed on the roof B of the vehicle A, and the photovoltaic generation light-blocking module 120 is coupled to the rack bodies 111 to allow the photovoltaic generation light-blocking plate 121 to move slidably along the rack bodies 111.

FIG. 3 is a view showing the photovoltaic generation light-blocking module 120 in a state where the roof A of the vehicle A is unfolded, in which the photovoltaic generation light-blocking plate 121 is positioned on a lower portion of the fixing plate 125, and at the same time, the first wire 242 is maintained in the state of being unwound from the opening and closing shaft 235, and the second wire 244 is maintained in the state of being wound around the opening and closing shaft 235.

Meanwhile, as shown in FIGS. 4 and 5, in order to shield the roof B exposed by the sliding movement of the photovoltaic generation light-blocking plate 121, the opening and closing shaft 235 is rotated in a clockwise direction by driving the transfer motor 131, such that the first wire 242 is wound on the outer circumferential surface of the first winding portion 235a, pulling the rear side frame of the photovoltaic generation light-blocking plate 121, while, at the same time, the second wire 244 is unwound from the second winding portion 235b, according to which the front side frame of the photovoltaic generation light-blocking plate 121 is moved slidably to shield the roof B of the vehicle A.

Hereinafter, a roof rack assembly 100 according to a second embodiment of the present disclosure will be described.

As shown in FIGS. 6 to 10, a roof rack assembly 100 according to a second embodiment of the present disclosure includes a roof rack 110 including a rack bodies 111 formed with a rack gear 111b, a photovoltaic generation light-blocking module 120 which are coupled to an upper portion of the rack bodies 111 to be slidably moved into a state or being overlapped on one another or spread from one another, and a light-blocking plate transfer portion 130 that generates a driving force to cause the photovoltaic generation light-blocking module 120 to be moved along the roof rack 110.

A pair of roof racks 110 are fixedly coupled to the roof B of the vehicle A. The pair of roof racks 110 include rack bodies 111 disposed side by side on both sides of the roof of the vehicle A, and fixing brackets 113 for coupling the rack bodies 111 to the roof B of the vehicle A. The rack bodies 111 are formed of a metal material to support a heavy load.

The rack bodies 111 are formed to have such a length that can cover the entire roof. Insertion grooves 111a are formed on side surfaces of the rack bodies 111, along which the gear housing 135 of the light-blocking plate transfer portion 130 is moved. The insertion grooves 111a are formed on both sides of the rack bodies 111 and recessed to a certain depth to receive the lower portion of the gear housing 135 to be inserted thereinto. Since the gear housing 135 is inserted into and moved along the insertion grooves 111a, the gear housing 135 can be prevented from being detached from the roof rack 110.

Rack gears 111b are formed along a longitudinal direction, on the upper surfaces of the rack bodies 111. The rack gears 111b are engaged with the transfer gear 133 of the light-blocking plate transfer portion 130 to be rotated. The photovoltaic generation light-blocking plate 121 is folded up or unfolded along the roof rack 110 by the rotation of the transfer gear 133 engaged with the rack gear 111b.

The fixing brackets 113 secure the rack bodies 111 on the upper portion of the vehicle A. The fixing brackets 113 are extended to the lower portions of the rack bodies 111. Bending inserts 113a are extended from the ends of the fixing bracket 113 and bent toward the sides of the vehicle A. The fixing brackets 113 are mounted on both sides of the roof of the vehicle A together with the rack bodies 111. At this time, the bending inserts 113a are inserted and supported in a door open/close port C. In this state, the fixing members 113c is inserted in the fixing brackets 113 to secure the rack bodies 111 on the roof of the vehicle A.

In this example, the fixing brackets 113 are elastically stretchable or rotatable in the rack bodies 111. Although not shown in the drawing, an elastic member (not shown) may be coupled between the upper ends of the fixing brackets 113 and the rack bodies 111. The user elastically splits apart or stretches the fixing bracket 113 to insert the same into the door open/close port C of the vehicle A. The fixing bracket 113 may be elastically fitted in the door open/close port C to stay in the coupled state.

A pair of rack bodies 111 are fixed to the roof of the vehicle A by the fixing bracket 113 being coupled to the door open/close port C.

At this time, protection members 111c may be provided on the lower surfaces of the rack bodies 111 to prevent damage to the roof B of the vehicle A due to contact with the roof of the vehicle A.

The fixing brackets 113 may be in the form of a coupling belt, a suction plate, a magnet, or the like, in addition to the form shown in the drawings.

Light-blocking plate coupling grooves 115 are formed at rear ends of the rack bodies 111 to a predetermined depth, to receive the fixing plate 125 of the photovoltaic generation light-blocking plate 121 coupled therein.

The photovoltaic generation light-blocking module 120 is movably provided between a pair of roof racks 110 to block sunlight from being directly shone onto the roof B of the vehicle, while also absorb sunlight to generate electric energy.

The photovoltaic generation light-blocking module 120 includes a photovoltaic generation light-blocking plate 121 that is moved between roof racks 110, an accumulator 127 that stores electric energy generated from the photovoltaic generation light-blocking plate 121, a converter 400 for converting the electric energy generated from the photovoltaic generation light-blocking plate 121 into a power for use in the vehicle, and a controller 129 that includes a control circuit for controlling the supply of power of the converter 400 and the accumulator 127.

The photovoltaic generation light-blocking plate 121 absorbs sunlight to generate electric energy. The plurality of photovoltaic generation light-blocking plates 121 may be arranged in an overlapped manner so as to be slidably moved relative to each other.

That is, the photovoltaic generation light-blocking plate 121 includes the fixing plate 125 disposed at the rear end relative to the driver's seat of the vehicle and fixed to the light-blocking plate coupling grooves 115 of the rack bodies 111, a traction plate 122 disposed on a leading end, and a plurality of moving plates 123 and 124 disposed between the traction plate 122 and the fixing plate 125.

However, the present disclosure is not limited thereto, and accordingly, only the photovoltaic generation light-blocking plate 121 and the fixing plate 125 may be formed depending on the size of the vehicle, or only one of the moving plates 123 and 124 may be formed.

As shown in FIG. 10A, projection insertion grooves 123b, 124b, and 125b are formed on the upper surfaces of the first and second moving plates 123 and 124 and the fixing plate 125 and recessed into a predetermined depth in a forward/backward direction of the vehicle, and transfer projections 122a, 123a and 124a are protruded from the lower surfaces of the traction plate 122 and the first and second moving plates 123 and 124, respectively.

Accordingly, the transfer projection 124a of the second moving plate 124 is inserted into the projection insertion grooves 125b of the fixing plate 125, the transfer projection 123a of the first moving plate 123 is inserted into the projection insertion groove 124b of the second moving plate 124, and the transfer projection 122a of the traction plate 122 is inserted into the projection insertion groove 123b of the first moving plate 123.

In this case, the support protrusions 141 protruded by a predetermined length in an outer direction of the projection insertion grooves 123b, 124b, and 125b are formed in the respective transfer projections 122a, 123a, and 124a so as not to be separated from the projection insertion grooves 123b, 124b, and 125b, and projection insertion grooves 142 are formed in the projection insertion grooves 123b, 124b, and 125b to receive the support protrusion 141 to be inserted therein.

The light-blocking plate transfer portion 130 is coupled to the lower portion of the traction plate 122. When the light-blocking plate transfer portion 130 is driven by supply of power, the traction plate 122 is moved to the leading end of the roof racks 110, pulling sequentially the first moving plate 123 into which the transfer projection 122a of the traction plate 122 is inserted, and the second moving plate 124 into which the transfer projection 123a of the first moving plate 123 is inserted.

Figure 6:
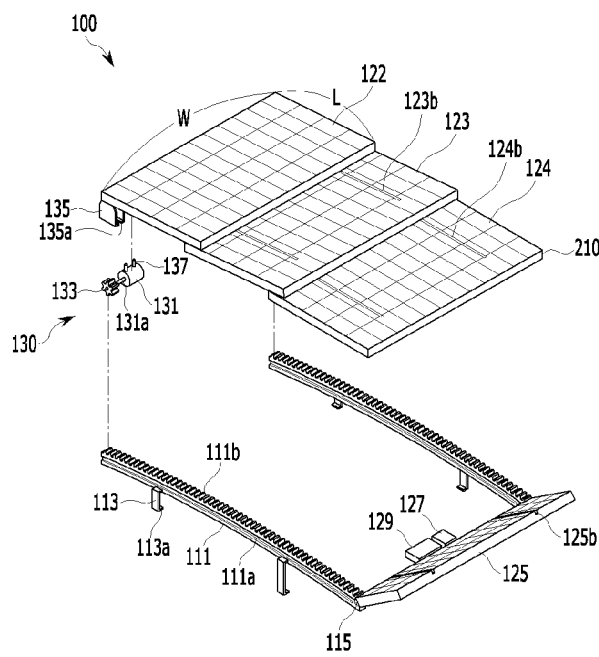
FIG. 6 is an exploded perspective view showing a roof rack assembly according to a second embodiment of the present disclosure.
Figure 8:
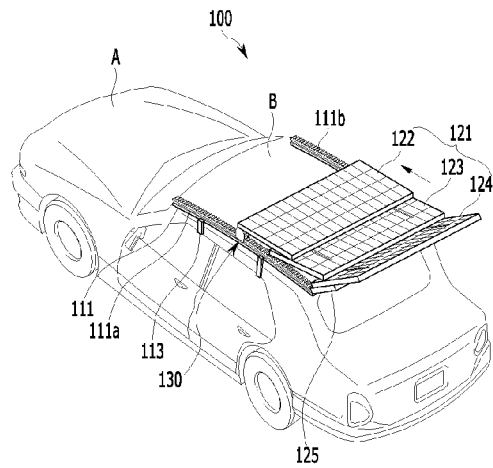
Figure 9:
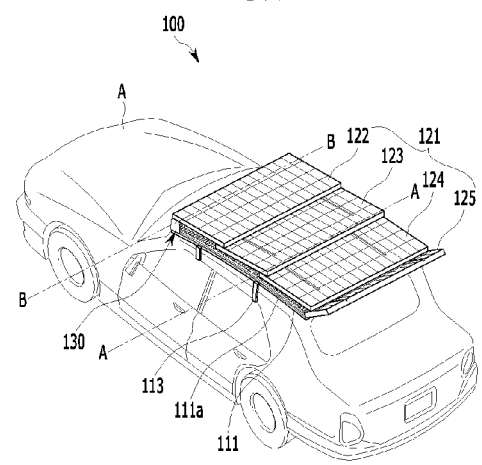
Figure 10:
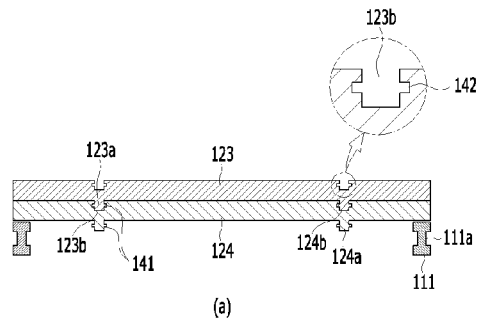
FIG. 10 is a cross-sectional view showing a cross section taken along lines I-I and II-II in FIG. 9.

As a result, the photovoltaic generation light-blocking plate 121, which is gathered in an overlapped manner as shown in FIG. 6, is spread over the roof of the vehicle A as shown in FIGS. 8 and 9.

The width W of the photovoltaic generation light-blocking plates 121 is provided to correspond to the width of the vehicle being used, and the length L thereof is provided by segments to correspond to the length of the vehicle being used. That is, the roof length of the vehicle being used may be divided by the number of the light-blocking plates 121 and the length of the light-blocking plate 121 may be set based on the result of the division.

In this example, while there are four (4) photovoltaic generation light-blocking plates 121 illustrated according to the preferred embodiment, this is merely an example, and accordingly, four or more photovoltaic generation light-blocking plates 121 may be installed. As the number of the photovoltaic generation light-blocking plates 121 increases, the length of the photovoltaic generation light-blocking plate 121 becomes shorter, in which case the photovoltaic generation light-blocking plates 121 can be at a lower height when they are folded up, but increased time may be required for the photovoltaic generation light-blocking plates 121 to be folded up or unfolded.

The photovoltaic generation light-blocking plates 121 may be unfolded over the roof B to block direct inflow of sunlight from entering the vehicle in weather like summer when sunlight is strong, or in the spring or autumn during daytime when direct sunlight can be strong, and the sunlight may be collected and stored to the back of the roof rack 110 as shown in FIG. 1 while the inside of the vehicle is being heated due to dropped external temperature during winter.

A converter 400 converts electric energy generated from the photovoltaic generation light-blocking plate 121. The electric energy generated from the photovoltaic generation light-blocking plate 121 is usually a DC voltage. The converter 400 converts the DC voltage to an AC voltage (e.g., 5V or 12V) for use in the transfer motor 131 or the vehicle battery 160.

The controller 129 includes a converter 400, and a control circuit for controlling such that, when the electric energy generated from the photovoltaic generation light-blocking plate 121 is introduced into a converter 400, the AC power converted from the converter 400 is stored into the accumulator 127. In addition, the controller controls such that the power of the accumulator 127 is supplied to the transfer motor 131 according to an input signal of an input unit 400.

The accumulator 127 and the controller 129 are fixed to the roof B of the vehicle A which is shielded by the first and second moving plates 123 and 124 so that the accumulator 127 and the controller 129 may be stably maintained in the position even with the vibrations that may occur while the vehicle is traveling.

Meanwhile, the controller 129 is electrically connected to an ECU (not shown) of the vehicle A to receive a control signal. The ECU (not shown) can be used to drive the vehicle A by receiving the power of the accumulator 127 when the power of the vehicle battery (not shown) is used up and the battery is discharged. In addition, when the power stored in the accumulator 127 is insufficient due to short daylight hours as in the rainy season, the power of the vehicle battery (not shown) may be used to drive the transfer motor 131 of the light-blocking plate transfer portion 130.

Further, in certain circumstances, the power stored in the accumulator 127 may be used to drive additional electric devices installed inside the vehicle A, such as, for example, a fan, a humidifier, a black box, navigation, and the like. Accordingly, various electric devices can be used while reducing the consumption of the vehicle battery (not shown) of the vehicle A.

The light-blocking plate transfer portion 130 moves the photovoltaic generation light-blocking plate 121 so that the photovoltaic generation light-blocking plate 121 is spread or gathered on the roof B of the vehicle A according to the driver's choice. The light-blocking plate transfer portion 130 includes a transfer motor 131 disposed at both lower ends of the leading end of the traction plate 122, a transfer gear 133 connected to the driving shaft 131a of the transfer motor 131 and rotated in mesh with the rack gear 111b, a gear housing 135 surrounding the outside of the transfer gear 133 and coupled to the traction plate 122 and the rack bodies 111, and a motor fixing frame 137 that fixes the transfer motor 131 to the traction plate 122.

A pair of light-blocking plate transfer portions 130 are provided on both sides of the leading end of the light-blocking plate 121.

The transfer motor 131 is fixed to the lower portion of the traction plate 122 by the motor fixing frame 137. The drive shaft 131a of the transfer motor 131 is connected to the rotating shaft of the transfer gear 133. The rotating shaft is rotatably coupled to the gear housing 135. When the transfer motor 131 is rotated forward, the transfer gear 133 is advanced along the rack gear 111b.

At this time, the upper end of the gear housing 135 is fixed to the upper portion of the traction plate 122, and rack inserts 135a bent at the lower end are inserted into the insertion grooves 111a of the rack bodies 111. When the transfer gear 133 is rotated in mesh with the rack gear 111b, the gear housing 135 is moved along the rack bodies 111. As a result, the transfer gear 133 is stably moved forward or backward along the rack bodies 111 without being separated to the outside.

The operation of the roof rack assembly 100 having such a configuration according to the present disclosure will be described with reference to FIGS. 7 to 9.

The driver installs the roof rack assembly 100 of the present disclosure on an upper portion of his or her vehicle. For the installation, the driver may have selected and purchased the roof rack assembly 100 that is compatible to his or her vehicle model. A pair of roof rack bodies 111 are arranged side by side on the roof B of the vehicle A and the fixing brackets 113 are split apart like a pincer and fit in the door open/close ports C on both sides of the vehicle A. The roof rack bodies 111 are fixed to the roof B of the vehicle A by inserting the bending inserts 113a of the fixing bracket 113 into the door open/close ports C.

The photovoltaic generation light-blocking module 120 is coupled to the roof rack bodies 111. The photovoltaic generation light-blocking plate 121 is movably coupled to the pair of roof rack bodies 111. The accumulator 127 for storing electric energy generated from photovoltaic generation and the controller 129 for controlling the accumulator 127 are coupled to the roof of the rear end of the roof rack bodies 111.

While the accumulator 127 and the controller 129 are shown as being exposed to the outside in the drawing, they may be accommodated in a control box (not shown), and the control box (not shown) may be coupled to the roof of the vehicle. In addition, the controller 129 and the accumulator 127 and the photovoltaic generation light-blocking plate 121 and the transfer motor 131 and the vehicle battery (not shown) are connected to each other by a power supply line.

At this time, power supply line is arranged so that the power supply line does not interfere or twist when the transfer motor 131 is rotated.

The controller 129 communicates with the ECU (not shown) of the vehicle transmits and receives control signals, and the accumulator 127 and the vehicle battery (not shown) can share the power with each other.

That is, the vehicle battery (not shown) can be used when the power supply of the accumulator 127 is insufficient and the power of the battery (not shown) can be used in the vehicle A when the power of the vehicle battery (not shown) is insufficient.

The input unit (not shown) may include a remote controller or may be coupled to one side of the roof rack 110. As shown in FIG. 7, when driving the vehicle A with not so strong sunlight, the driver may have the photovoltaic generation light-blocking plate 121 be gathered on the rear end of the roof rack 110 and keep driving.

Accordingly, with the photovoltaic generation light-blocking plate 121 being gathered at the rear end, the driver may load the cargo on top of the roof rack 110. For example, if it is winter, ski equipment may be loaded, or other leisure equipment may also be loaded on the roof rack 110.

However, as the amount of sunshine is increased during the daytime, the photovoltaic generation light-blocking plate 121 is spread on the roof B, as shown in FIG. 9. The controller 129 supplies the power of the accumulator 127 to the pair of transfer motors 131 when an instruction to use the photovoltaic generation light-blocking plate 121 is input through an input unit (not shown).

As the transfer motor 131 is rotated, the transfer gear 133 is rotated and moved along the rack gear 111b. The traction plate 122 coupled to the gear housing 135 is also moved forward when the transfer gear 133 and the gear housing 135 are moved forward of the roof rack 110 along the rack gear 111b. As the traction plate 122 is gradually moved, the first moving plate 123, into which the transfer projection 122a of the traction plate 122 is inserted, is also moved forward, and the second moving plate 124 is also moved forward of the roof B to cover the roof B as shown in FIG. 8.

As shown in FIG. 9, when the photovoltaic generation light-blocking plate 121 covers the entire roof B, the driving of the transfer motor 133 is stopped by a signal from a position sensor (not shown) or a limit sensor (not shown). The photovoltaic generation light-blocking plate 121 covers the entire roof B to prevent sunlight from directly contacting the roof B. As a result, the heat of the sunlight is prevented from entering the interior of the vehicle, thereby enhancing the cooling effect inside the vehicle.

Meanwhile, the sunlight is absorbed into the surface of the photovoltaic generation light-blocking plate 121 to be generated into electric energy. The electric energy is converted by the converter 400 into AC power of the voltage that can be used in the vehicle and then stored in the accumulator 127.

The power stored in the accumulator 127 can be used to drive the transfer motor 131. This energy can also be used for other purposes, such as starting the vehicle or driving the in-vehicle devices, and so on, when the power of the vehicle battery (not shown) is insufficient.

In addition, the power of the accumulator (not shown) may be used to turn on the light during outdoor activity such as camping, to use as an emergency power source at a remote area, or to supply power to the camper.

Figure 7:
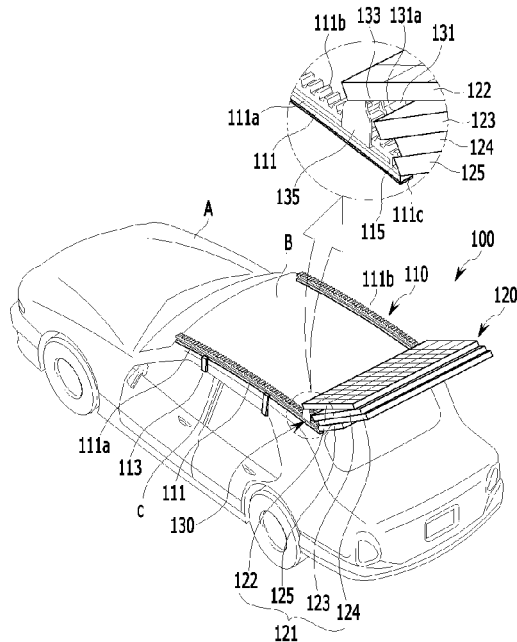
FIGS. 7 to 9 are views showing a state in which a roof rack assembly is deployed on a roof of a vehicle according to the second embodiment of the present disclosure.

Meanwhile, the photovoltaic generation light-blocking plate 121 is moved to the rear end of the roof rack 110 during time zone of insufficient amount of sunshine, as shown in FIG. 7. At this time, when an input signal is applied through the input unit (not shown), the transfer motor 131 is rotated in the opposite direction, and the traction plate 122 is moved to the rear end of the roof rack 110.

When the traction plate 122 is moved to the rear end, the transfer projection 122a of the traction plate 122 is moved backward along the projection insertion groove 123b of the first moving plate 123. When the transfer gear 133 is continuously moved backward even after the transfer projection 122a of the traction plate 122 is moved to the end of the projection insertion groove 123b of the first moving plate 123, the traction plate 122 and the first moving plate 123 are moved upward to the overlapped position, and the first moving plate 123 is moved to the upper surface of the second moving plate 124.

In this manner, the traction plate 122, the first moving plate 123 and the second moving plate 124 are sequentially stacked and gathered on one another on the fixing plate 125.

Accordingly, according to the first embodiment adopting the wire winding system, the light-blocking plate transfer portion 130 according to the present disclosure is preferably mounted on the fixing plate 125 when the photovoltaic generation light-blocking plate 121 is opened or closed, while, according to the second embodiment adopting the gear coupling structure, the light-blocking plate transfer portion 130 according to the present disclosure is preferably mounted on the lower portion of the traction plate 122 when the photovoltaic generation light-blocking plate 121 is opened or closed.

Figure 11:
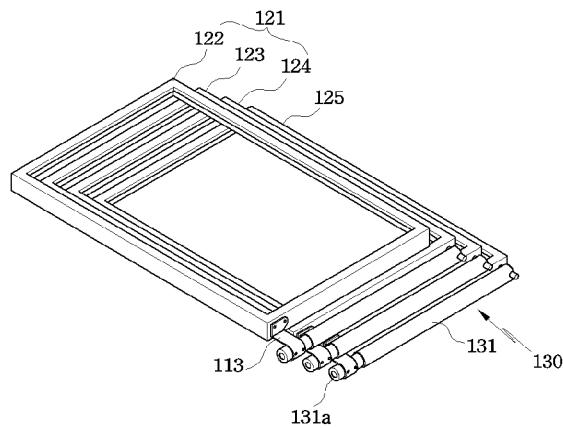
FIGS. 11 and 12 are perspective views showing a frame structure of a roof rack assembly according to a third embodiment of the present disclosure.
Figure 12:
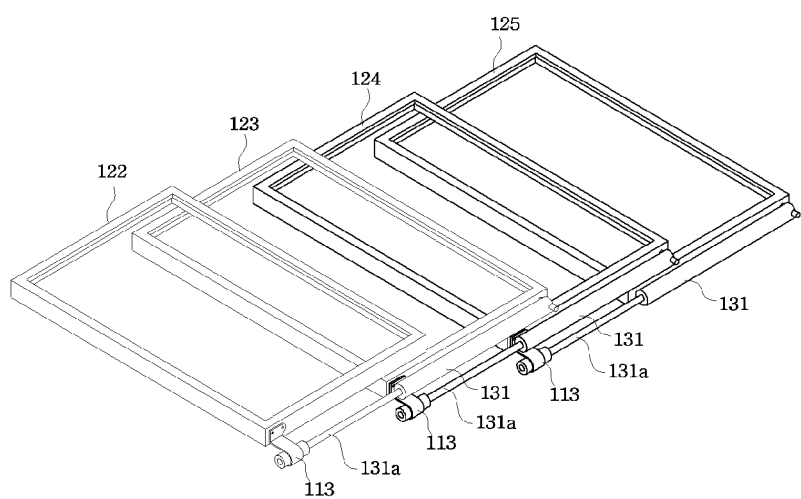

Meanwhile, as shown in FIGS. 11 and 12, according to the present disclosure, the light-blocking plate transfer portion 130 that slidably moves the photovoltaic generation light-blocking plate 121 including the traction plate 122, the first and second moving plates 123 and 124 and the fixing plate 125, may be configured with a hydraulic cylinder 131, in which case the hydraulic cylinder 131 may be connected to the plates 122, 123, 124 and 125 constituting the photovoltaic generation light-blocking plate 121, respectively, as shown in FIGS. 11 and 12.

At this time, the drive shaft 131a that is pulled in and out in accordance with the operation of the hydraulic cylinder 131 may be coupled to the traction plate 122 and the first and second moving plates 123 and 124 only such that the opening and closing operation of the traction plate 122 and the first and second moving plates 123 and 124 of the photovoltaic generation light-blocking plate 121 by the sliding movement can be performed according to the pulling-in and pulling-out operations of the hydraulic cylinder 131.

That is, the end portion of the cylinder body portion formed in the hydraulic cylinder 131 is coupled to the fixing plate 125, and the drive shaft 131a formed at the leading end of the hydraulic cylinder 131 is fixedly coupled to the second moving plate 124 by the fixing bracket 113, so that the drive shaft 131a is driven in accordance with the operation of the hydraulic cylinder 131, resulting in the second moving plate 124 being slidably moved.

In addition, the cylinder body portion of the hydraulic cylinder 131 is respectively coupled to the second moving plate 124 and the first moving plate 123, respectively, and the driving shaft 131a formed at the leading end thereof is fixedly coupled to the first moving plate 123 and the traction plate 122, respectively, by the fixing bracket 113, such that each of the plates 122, 123, 124 and 125 is slidably and separately moved according to the mode of operation of the hydraulic cylinder 131.

Referring to FIGS. 13 to 18, a hood light-blocking fabric assembly 300 capable of photovoltaic generation according to a fourth embodiment of the present disclosure includes an upper photovoltaic generation plate 310, an upper photovoltaic generation plate 320, a transfer/tilting unit 330, a first driving portion 340, and a second driving portion 350.

The upper photovoltaic generation plate 310 is formed in a rectangular plate shape and is configured with a solar panel capable of general photovoltaic generation.

The upper photovoltaic generation plate 310 is fixedly mounted to the upper surface of the hood 2 and is in such a size that can cover the hood 2.

The upper photovoltaic generation plate 320 is configured with a solar panel capable of photovoltaic generation in the same manner as the lower photovoltaic generation plate 310. However, the upper photovoltaic generation plate 320 is configured to be smaller than the lower photovoltaic generation plate 310.

The upper photovoltaic generation plate 320 preferably has a size to cover the front glass 3 of the vehicle 1.

Figure 13:
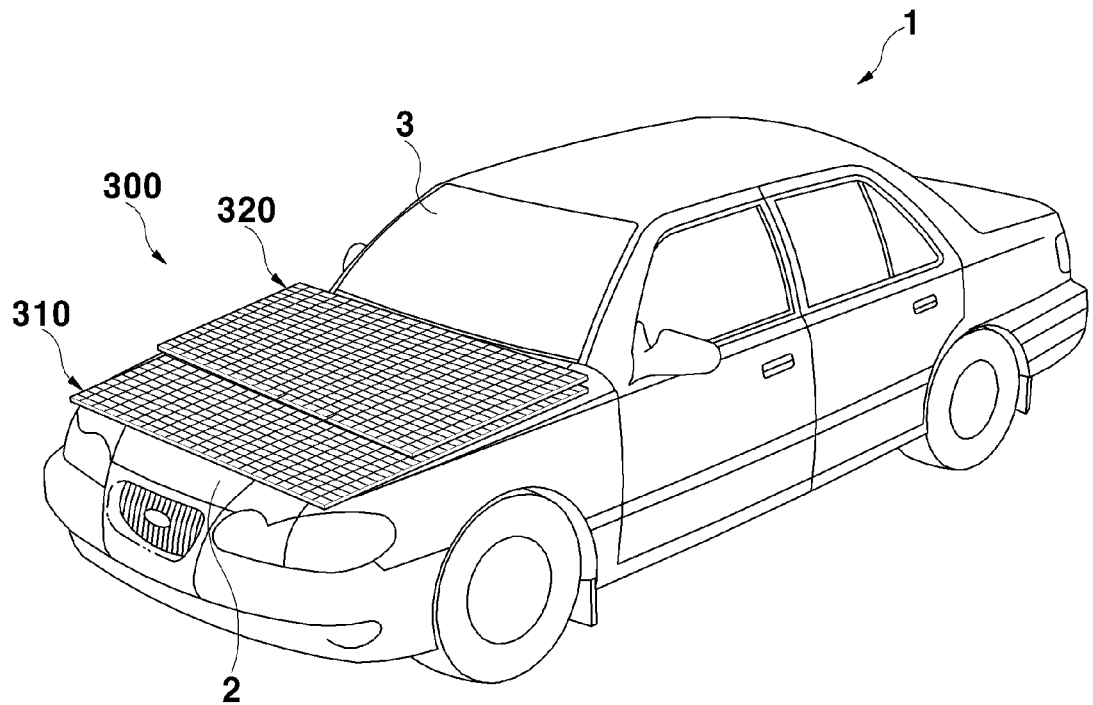
FIG. 13 is a perspective view showing a light-blocking fabric assembly according to a fourth embodiment of the present disclosure.
Figure 14:
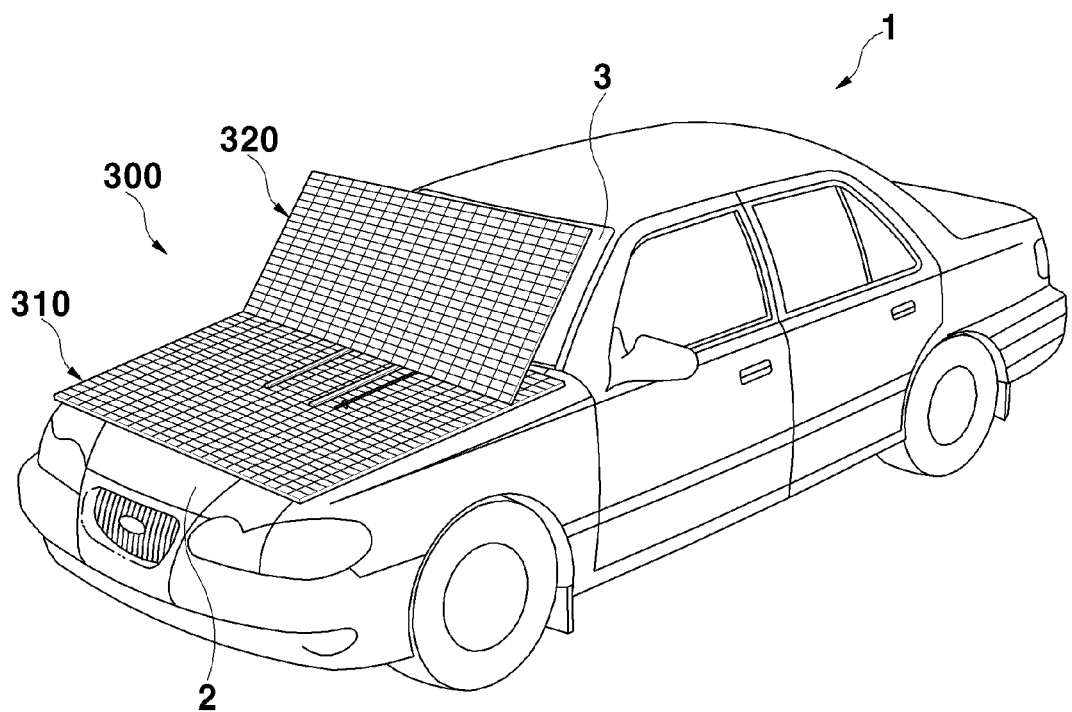
FIG. 14 is a view showing a state in which the light-blocking fabric assembly of FIG. 13 is transformed during vehicle stop.
Figure 15:
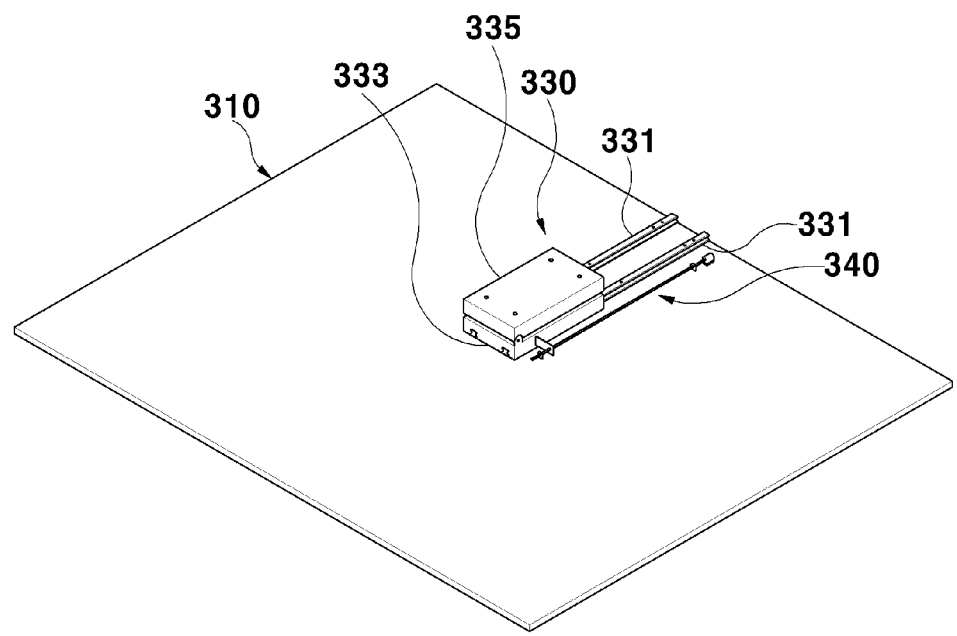
FIG. 15 is a view showing a configuration of a transfer tilting unit and a first driving portion in a state in which the upper photovoltaic generation plate of FIG. 13 is removed.
Figure 16:
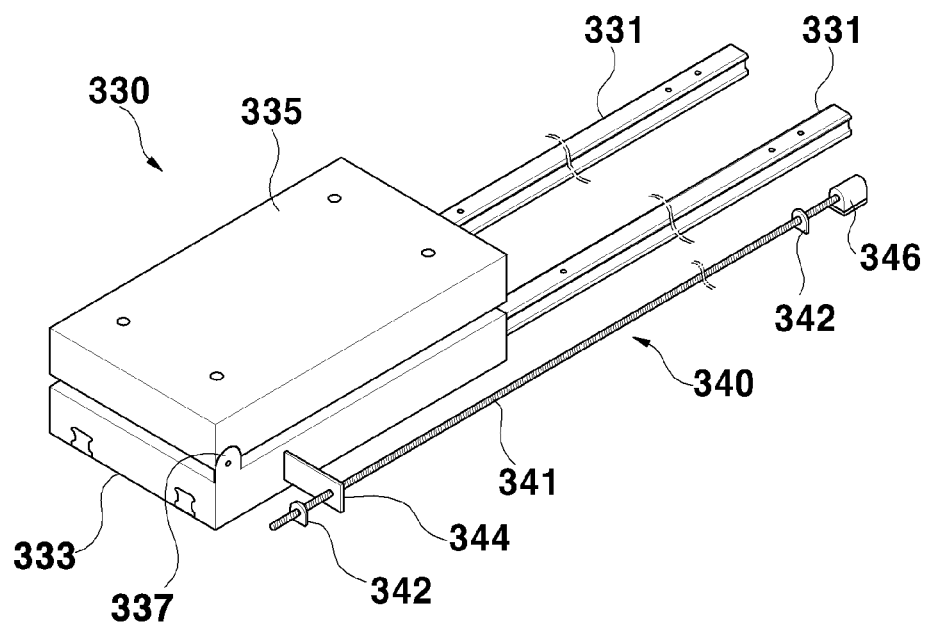
FIG. 16 is an enlarged view of the transfer tilting unit and the first driving portion shown in FIG. 15.
Figure 17:
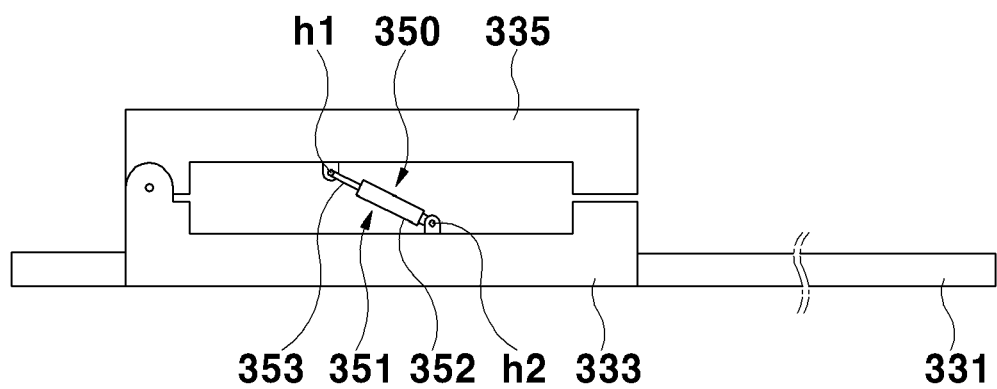
FIG. 17 is a side sectional view showing a second driving portion installed in the transfer tilting unit.
Figure 18:
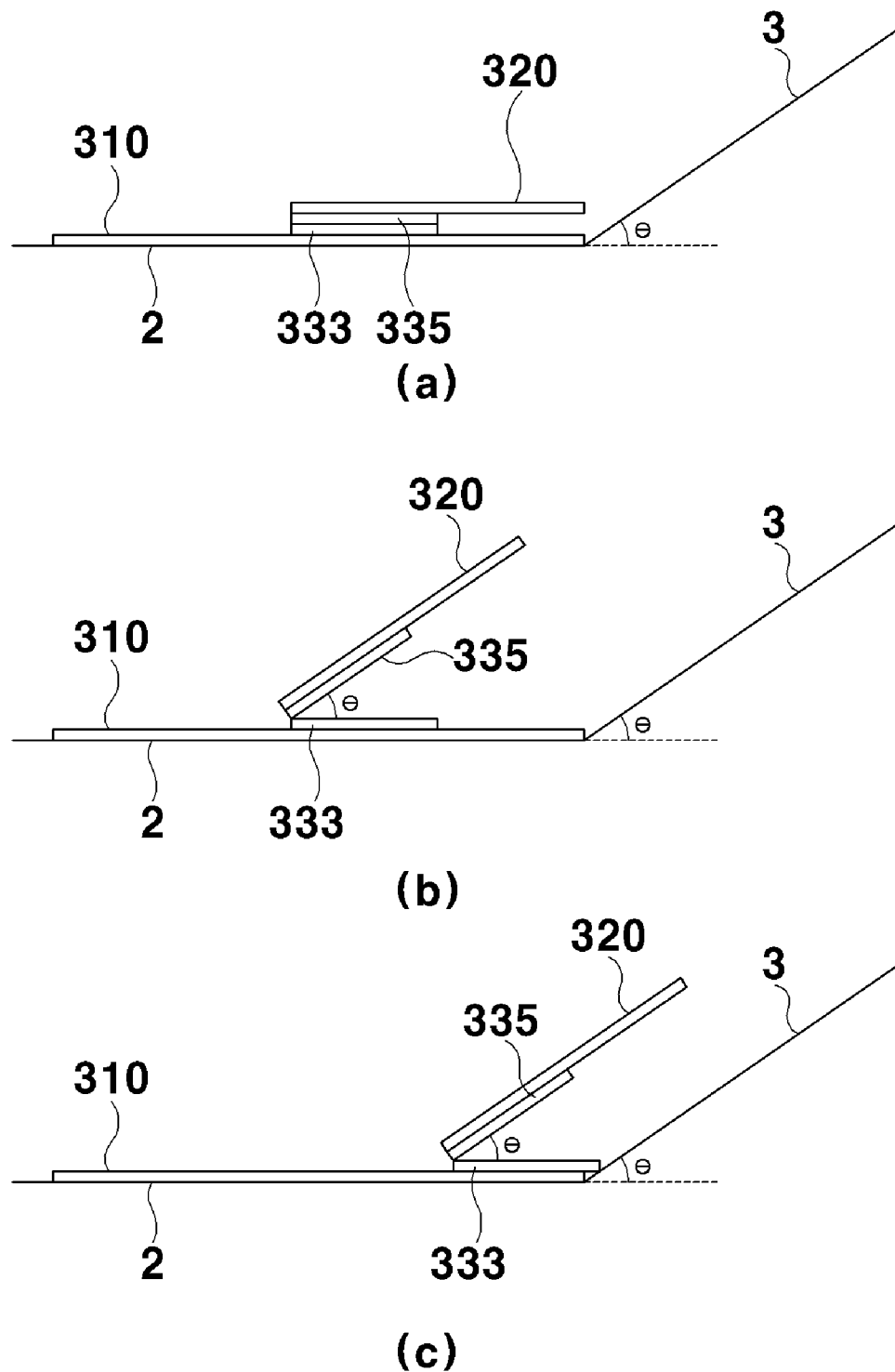
FIG. 18 is a view showing a light-blocking fabric assembly in use according to a fourth embodiment of the present disclosure.

The upper photovoltaic generation plate 320 is configured such that it 320 can change position between a first position at which the upper photovoltaic generation plate 320 overlaps the rear portion of the lower photovoltaic generation plate 310 as shown in FIG. 13 and a second position at which the upper photovoltaic generation plate 320 covers the front glass 3 of the vehicle 1 as shown in FIG. 14.

The transfer/tilting unit 330 moves the upper photovoltaic generation plate 320 in the forward/backward direction and rotates the upper photovoltaic generation plate 320 by a predetermined angle in an upward/downward direction with respect to the lower photovoltaic generation plate 310 to guide the upper photovoltaic generation plate 320 to be positionally adjusted to the first position or the second position.

The transfer/tilting unit 330 includes a rail unit 331, a forward/backward moving member 333, and an upward/downward pivot member 335.

The rail unit 331 is fixedly mounted to the rear portion of the lower photovoltaic generation plate 310 in the forward/backward direction. At this time, a pair of rail units 331 may be installed side by side.

The forward/backward moving members 333 is formed in a rectangular plate shape and is guided along the rail unit 331 to be moved in the forward/backward direction.

The rail unit 331 is configured with an LM guide, in which the rail of the LM guide may be fixedly mounted to the lower photovoltaic generation plate 310, and the guide of the LM guide may be fixed to the forward/backward moving member 333. In addition to the LM guide, the rail unit 331 may have any form as long as the forward/backward moving member 333 can be guided in the forward/backward direction relative to the rail unit 331.

The upward/downward pivot member 335 is formed in a rectangular plate shape, and the front portion thereof is vertically pivotable on a hinge part 337. Accordingly, the upward/downward pivot member 335 can be pivoted by a predetermined angle relative to the forward/backward moving member 333 about the hinge part 337. In addition, the upper surface of the upward/downward pivot member 335 is coupled to the lower surface of the upper photovoltaic generation plate 320.

According to the configuration described above, as the forward/backward moving member 333 is moved in the forward/backward direction with respect to the rail unit 331, the upper photovoltaic generation plate 320 can be moved in the forward/backward direction with respect to the lower photovoltaic generation plate 310, and the upper photovoltaic generation plate 320 can be pivoted by a predetermined angle with respect to the lower photovoltaic generation plate 310 in an upward/downward direction, as the upward/downward pivot member 335 is pivoted with respect to the forward/backward moving member 333. At this time, the tilting angle of the upper photovoltaic generation plate 320 with respect to the lower photovoltaic generation plate 310 is preferably equal to the angle of the front glass 3.

The first driving portion 340 provides a driving force for moving the upper photovoltaic generation plate 320 in a forward/backward direction relative to the lower photovoltaic generation plate 310, and includes a rotation bar 341, an activating member 344, and an electric motor 346.

Both ends of the rotation bar 341 are rotatably supported by a pair of rotation support members 344 installed on the lower photovoltaic generation plate 310 and are rotatably installed on the lower photovoltaic generation plate 310.

At this time, the rotation bar 341 has a thread (not shown) formed on its outer circumferential surface.

The rotation bar 341 is installed alongside the rail unit 331 and disposed at the rear side of the lower photovoltaic generation plate 310 in the forward/backward direction.

One end of the activating member 344 is fixed to one side of the forward/backward moving member 333 and is extended laterally of the forward/backward moving member 333, while the other end of the activating member 344 is coupled with the rotation bar 341 in a form of a ball-screw with the rotation rod 341 passing therethrough. Accordingly, as the rotation bar 341 is rotated, the activating member 344 is moved forward or backward along the rotation bar 341, and the forward/backward moving member 333 is also moved forward and backward in association with the rotation bar 341.

The electric motor 346 is installed on the lower photovoltaic generation plate 310 and the rotating shaft is connected to the rotation bar 341 to rotate the rotation bar 341.

With the above configuration, when the electric motor 346 is rotated in one direction, the forward/backward moving member 333 is advanced to move the upper photovoltaic generation plate 320 forward with respect to the lower photovoltaic generation plate 310, and conversely, that is, when the electric motor 346 is rotated in the other direction, the forward/backward moving member 333 is moved backward to move the upper photovoltaic generation plate 320 backward relative to the lower photovoltaic generation plate 310.

The second driving portion 350 includes a cylinder body 352, and an electric cylinder 351 having a rod 353 which is stretchably installed in the cylinder body 352. The electric cylinder 351 connects the upward/downward pivot member 335 to the forward/backward moving member 333. Specifically, one end of the electric cylinder 351 is pivotably installed on the lower surface of the upward/downward pivot member 335 by a first hinge h1, and the other end of the electric cylinder 351 is pivotably installed on the upper surface of the forward/backward moving member 333 by a second hinge h2.

With the above configuration, when the rod 353 is stretched by driving the second driving portion 350, the upward/downward pivot member 335 is rotated by a predetermined angle with respect to the forward/backward moving member 333. Accordingly, the upper photovoltaic generation plate 320 is pivoted with respect to the lower photovoltaic generation plate 310 to be tilted at a predetermined angle. Conversely, when the rod 353 is contracted by driving the second driving portion 350, the upward/downward pivot member 335 is juxtaposed on an upper portion of the forward/backward moving member 333, such that the upper photovoltaic generation plate 320 is juxtaposed on the upper portion of the lower photovoltaic generation plate 310.

The present disclosure may include a controller (not shown) for controlling the driving of the electric motor 346 of the first driving portion 340 and the electric cylinder 351 of the second driving portion 350, and the controller (not shown) may be controlled by a wireless operating means such as a remote controller, or automatically controlled by a pre-installed program.

The present disclosure may include a converter 400 for converting the electric energy generated from the lower photovoltaic generation plate 310 and the upper photovoltaic generation plate 320 into a power available for use in the vehicle, and an accumulator for storing the power converted by the converter 400.

The accumulator may be equipped in a trunk of a vehicle or the like and may be used in connection with various electronic devices for use in the vehicle, such as a humidifier, a fan, a blower, a lantern, a laptop computer, and so on.

Hereinafter, the operation of the light-blocking fabric assembly 300 according to the fourth embodiment of the present disclosure will be described with reference to FIGS. 13 to 18.

In the present disclosure, the upper photovoltaic generation plate 320 can change position between a first position at which the upper photovoltaic generation plate 320 overlaps the rear portion of the lower photovoltaic generation plate 310 as shown in FIGS. 13 and 18A, and a second position at which the upper photovoltaic generation plate 320 covers the front glass 3 of the vehicle as shown in FIGS. 14 and 18B.

FIGS. 13 and 18A show a state (first position) that the second driving portion 350 is driven under the control of a controller (not shown) so that the upward/downward pivot member 335 is tilted at a predetermined angle with respect to the forward/backward moving member 333, resulting in the upper photovoltaic generation plate 320 being tilted at a predetermined angle with respect to the lower photovoltaic generation plate 310 as shown in FIG. 18B.

In this state, the first driving portion 340 is driven under the control of the controller (not shown), and the forward/backward moving member 333 is moved backward along the rail unit 331, resulting in the upper photovoltaic generation plate 320 being moved backward, that is, toward the front glass 3, such that the upper photovoltaic generation plate 320 covers the front glass 3 (second position) as shown in FIGS. 14 and 18C.

According to the present disclosure, when the vehicle is traveling, the upper photovoltaic generation plate 320 is placed at the first position at which the upper photovoltaic generation plate 320 overlaps the lower photovoltaic generation plate 310 as shown in FIG. 13, and when the vehicle is stopped, the upper photovoltaic generation plate 320 is tilted at a predetermined angle with respect to the lower photovoltaic generation plate 310 and moved to the front glass 3 side and transformed into the second position at which the upper photovoltaic generation plate 320 covers the front glass 3.

To this end, the controller (not shown) is configured to be operated in association with the vehicle ECU such that, when the transmission of the vehicle is in D, the first driving portion 340 and the second driving portion 350 are controlled so that the upper photovoltaic generation plate 320 is in the second position state as shown in FIG. 13, and when the transmission of the vehicle is in N or P, the first driving portion 340 and the second driving portion 350 can be controlled so that the upper photovoltaic generation plate 320 is in the second position state as shown in FIG. 14.

As discussed above, according to the present disclosure, the lower photovoltaic generation plate 310 and the upper photovoltaic generation plate 320, which are overlapped on the rear side, cover the hood 2 of the vehicle 1, to block the inflow of the heat of sunlight into the interior of the vehicle, thereby preventing the internal temperature of the vehicle from rising, while producing electricity through the sunlight at the same time.

Therefore, the present disclosure can prevent the internal temperature rise of the vehicle to prevent fire, reduce the operation of the air conditioner to reduce fuel consumption, and the generated electricity can be used for driving the internal devices of the vehicle and can also be used as power source for various devices for outdoor activities.

Further, during stop of the vehicle, because the lower photovoltaic generation plate 310 is transformed to cover the hood 2 and the upper photovoltaic generation plate 320 is transformed to cover the front glass 3, the power generation area is increased, resulting in increased amount of electricity production, and at the same time, the hood 2 and the front glass 3 are shielded from the sunlight, resulting in the temperature inside the vehicle can be further prevented from rising.

In the present disclosure, the closer the upper photovoltaic generation plate 320 is to the front glass 3, the higher the shading efficiency can be obtained for the front glass 3. In this case, the distance between the upper photovoltaic generation plate 320 and the front glass 3 can be reduced according to the design of the length of the forward/backward moving members 333. Further, the distance between the upper photovoltaic generation plate 320 and the front glass 3 can be minimized according to the configuration of the transfer/tilting unit 330, the first driving portion 340 and the second driving portion 350.

In addition, according to the configuration of the present disclosure, the lower photovoltaic generation plate 310 is fixed to the hood 2, and the upper photovoltaic generation plate 320 is overlapped on the rear upper portion of the lower photovoltaic generation plate 310 or is positionally transformed to cover the front glass 3, while the transfer/tilting unit 330, the first driving portion 340, and the second driving portion 350 configured to move the upper photovoltaic generation plate 320 are not limited to the configuration descried above, and accordingly, the upper photovoltaic generation plate 320 may be moved forward/backward with respect to the lower photovoltaic generation plate 310 so that the upper photovoltaic generation plate 320 may be tilted at a predetermined angle, or any other configuration may be used.

Figure 19:
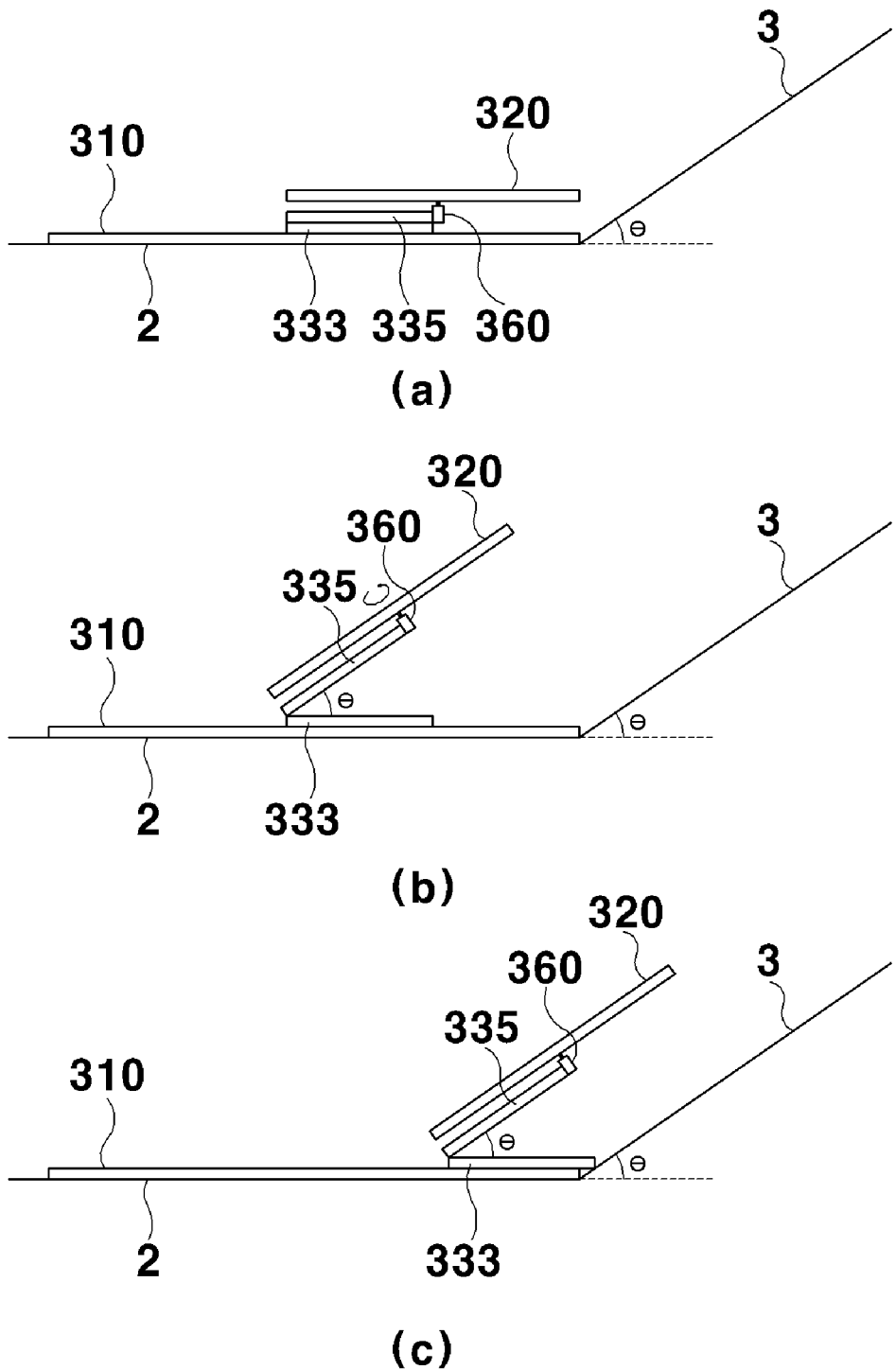
FIG. 19 is a view showing a light-blocking fabric assembly in use according to a fifth embodiment of the present disclosure.
Figure 20:
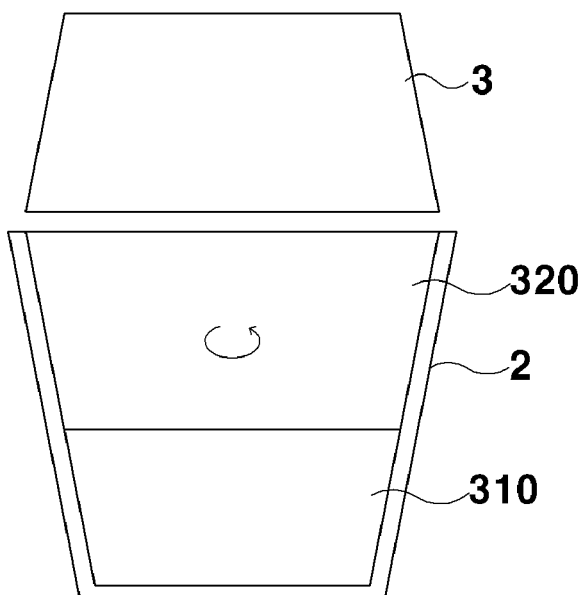
FIG. 20 is a view of the light-blocking fabric assembly according to the fifth embodiment of the present disclosure seen from above.
Figure 20:
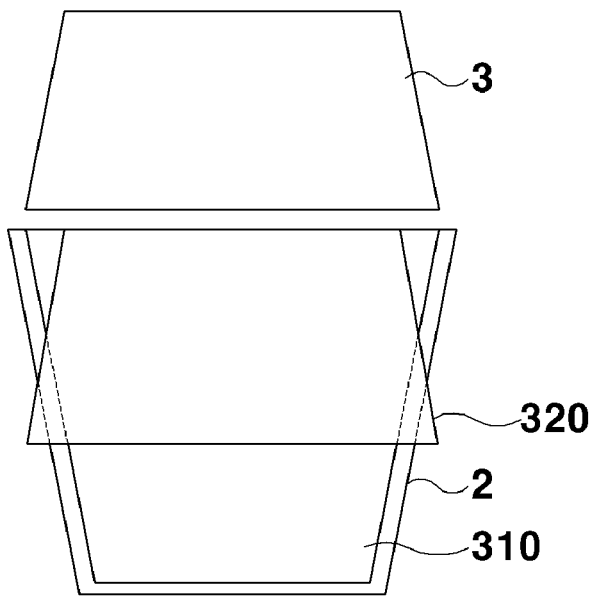

Hereinafter, the light-shielding film assembly according to the fifth embodiment of the present disclosure will be described with reference to FIGS. 19 and 20.

The light-shielding film assembly of the fifth embodiment differs from the fourth embodiment in that a third driving portion 360 is provided.

In the description of the fifth embodiment, the same components as those in the fourth embodiment are denoted by the same reference numerals, and the same configuration will not be described redundantly, and the different configuration will be described.

A third drive unit 360, which includes an electric motor, is fixed to the end of the upward/downward pivot member 335, and a rotating shaft of the third driving portion 360 is coupled to the center of the upper photovoltaic generation plate 320.

According to the configuration described above, the upper photovoltaic generation plate 320 may be rotated 180 degrees in accordance with the driving of the third driving portion 360.

In the fifth embodiment, the lower photovoltaic generation plate 310 is formed in a rectangular plate shape, in which a front side is narrower than a rear side according to the general shape of the hood 2, and the upper photovoltaic generation plate 320 may be formed in such a shape that corresponds to a rear portion of the photovoltaic generation plate 320.

As shown in FIGS. 19A and 20A, with the upper photovoltaic generation plate 320 being in the first position at which the upper photovoltaic generation plate 320 overlaps the lower photovoltaic generation plate 310, when the second driving portion 350 is driven under the control of the controller (not shown), the upper photovoltaic generation plate 320 is tilted at a predetermined angle with respect to the lower photovoltaic generation plate 310 as shown in FIG. 18B.

In this state, when the third driving portion 360 is driven by the controller (not shown), the upper photovoltaic generation plate 320 is rotated 180 degrees with respect to the lower photovoltaic generation plate 310 as shown in FIG. 20B.

In this state, when the first driving portion 340 is driven by the controller (not shown), the upper photovoltaic generation plate 320 is moved backward to cover the front door 3 in proximity to the front door 3 as shown in FIG. 19C.

As described above, according to the present disclosure, the upper photovoltaic generation plate 320 may be rotated 180 degrees to correspond to the shape of the front door 3 when the upper photovoltaic generation plate 320 is moved to the second position at which the upper photovoltaic generation plate 320 the front door 3, and as a result, the light shading efficiency of the front door 3 can be further increased.

Figure 21:
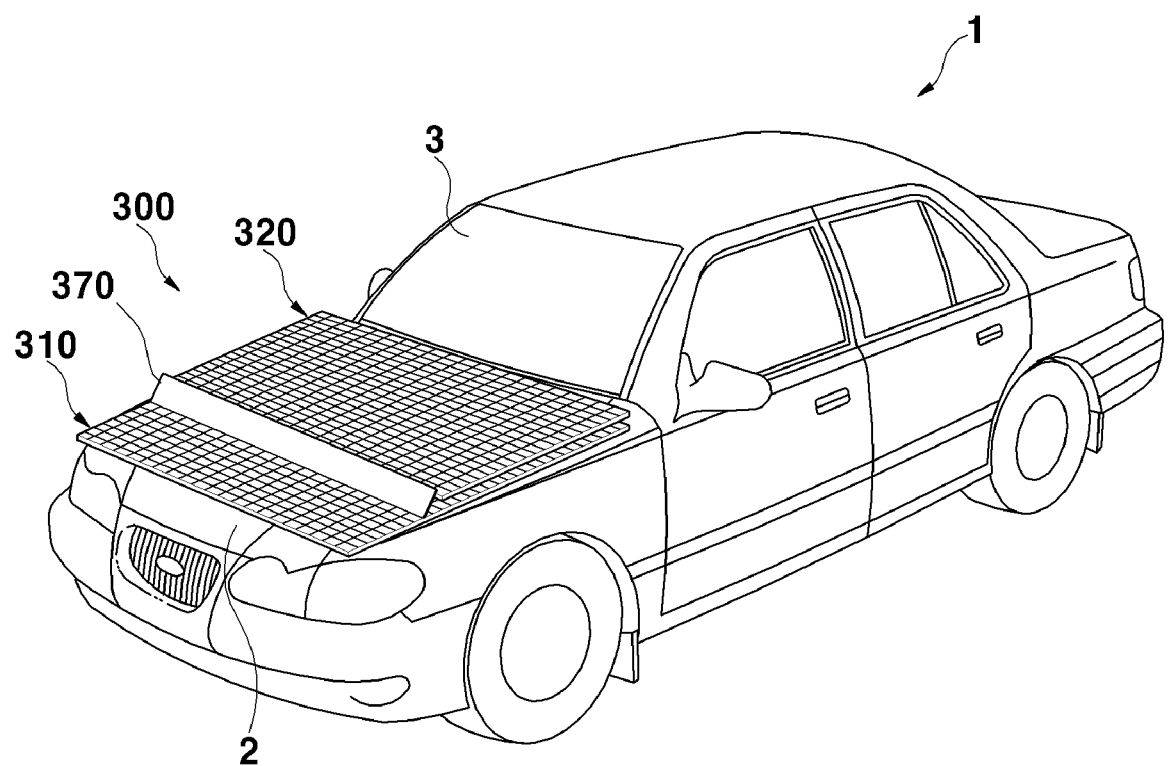
FIG. 21 is a perspective view showing a light-blocking fabric assembly according to a sixth embodiment of the present disclosure.

Referring to FIG. 21, according to the present disclosure, an air guide plate 370 serving as a spoiler may be installed on the front portion of the lower photovoltaic generation plate 310. The air guide plate 370 is tilted at a predetermined angle and is formed to cover the front of the upper photovoltaic generation plate 320. As described above, according to the present disclosure, air blockage by the upper photovoltaic generation plate 320 can be prevented when the vehicle is traveling, thereby preventing air resistance generated by the upper photovoltaic generation plate 320.

While the present disclosure has been particularly shown and described with reference to exemplary embodiments thereof, it is to be understood that the invention is not limited to the disclosed exemplary embodiments. It will be appreciated by those skilled in the art that numerous changes and modifications of the invention are possible without departing from the spirit and scope of the appended claims. Accordingly, all such modifications and variations are intended to fall within the scope of the present disclosure.

INDUSTRIAL APPLICABILITY

According to the present disclosure, the present disclosure relates to a roof rack assembly and a hood light-blocking fabric assembly that are capable of photovoltaic generation, and can be widely used in automobile related industries.

The invention claimed is:
1. A hood light-blocking fabric assembly capable of photovoltaic generation comprising:
    a lower photovoltaic generation plate fixedly installed to cover the hood of a vehicle and configured to prevent inflow of heat energy of sunlight into the vehicle, to absorb sunlight, and to produce electricity accordingly;
    an upper photovoltaic generation plate installed on an upper portion of the lower photovoltaic generation plate and moveable between a first position at which the upper photovoltaic generation plate overlaps the upper portion of the lower photovoltaic generation plate and a second position at which the upper photovoltaic generation plate covers a front glass of the vehicle;
    a transfer/tilting unit for moving the upper photovoltaic generation plate forward/backward with regard to the lower photovoltaic generation plate and rotating the same upward/downward by a predetermined angle such that the upper photovoltaic generation plate can be positioned at the first location or at the second location;

a first driving portion for providing a driving force such that the upper photovoltaic generation plate is moved forward/backward with regard to the lower photovoltaic generation plate; and a second driving portion for providing a driving force such that the upper photovoltaic generation plate is tilted with regard to the lower photovoltaic generation plate by a predetermined angle.

2. The hood light-blocking fabric assembly capable of photovoltaic generation of claim 1, wherein the transfer/tilting unit comprising:

a rail unit installed on the lower photovoltaic generation plate in a forward/backward direction;

a forward/backward moving member to be moved along the rail unit; and an upward/downward pivot member installed to be rotatable by a predetermined angle with respect to the forward/backward moving member and having the upper photovoltaic generation plate installed at an upper end thereof.

3. The hood light-blocking fabric assembly capable of photovoltaic generation of claim 2, wherein the first driving portion comprising:

a rotation bar rotatably installed on the lower photovoltaic generation plate and including a thread formed on an outer circumferential surface thereof;

an electric motor that rotates the rotation bar; and an activating member, one end of which is fixed to the forward/backward moving member and the other end of which is coupled to the rotation bar in a ball-screw form, to move the forward/backward moving member in the forward/backward direction while moving along the rotation bar in accordance with rotation of the rotation bar.

4. The hood light-blocking fabric assembly capable of photovoltaic generation of claim 2, wherein the second driving portion includes an electric cylinder unit installed to connect the forward/backward moving member to the upward/downward pivot member, to pivot the upward/downward movable member with respect to the forward/backward moving member by a predetermined angle in accordance with a stretching operation.

5. The hood light-blocking fabric assembly capable of photovoltaic generation of claim 2, further comprising a third driving portion installed to connect the upward/downward moving member to the upper photovoltaic generation plate to rotate the upper photovoltaic generation plate with respect to the upper moving member.

6. The hood light-blocking fabric assembly capable of photovoltaic generation of claim 1, further comprising an air guide plate installed at a front portion of the lower photovoltaic generation plate to prevent air resistance of the upper photovoltaic generation plate when the vehicle is traveling.

7. A hood light-blocking fabric assembly capable of photovoltaic generation comprising:

a lower photovoltaic generation plate fixedly installed to cover the hood of a vehicle;

an upper photovoltaic generation plate installed on an upper portion of the lower photovoltaic generation plate and moveable between a first position at which the upper photovoltaic generation plate overlaps the upper portion of the lower photovoltaic generation plate and a second position at which the upper photovoltaic generation plate covers a front glass of the vehicle;

an air guide plate installed at a front portion of the lower photovoltaic generation plate;

a transfer/tilting unit for moving the upper photovoltaic generation plate forward/backward with regard to the lower photovoltaic generation plate and rotating the same upward/downward by a predetermined angle such that the upper photovoltaic generation plate can be positioned at the first location or at the second location;

a first driving portion for providing a driving force such that the upper photovoltaic generation plate is moved forward/backward with regard to the lower photovoltaic generation plate; and a second driving portion for providing a driving force such that the upper photovoltaic generation plate is tilted with regard to the lower photovoltaic generation plate by a predetermined angle.

8. The hood light-blocking fabric assembly capable of photovoltaic generation of claim 7, wherein the transfer/tilting unit comprising:

a rail unit installed on the lower photovoltaic generation plate in a forward/backward direction;

a forward/backward moving member to be moved along the rail unit; and an upward/downward pivot member installed to be rotatable by a predetermined angle with respect to the forward/backward moving member and having the upper photovoltaic generation plate installed at an upper end thereof.

9. The hood light-blocking fabric assembly capable of photovoltaic generation of claim 8, wherein the first driving portion comprising:

a rotation bar rotatably installed on the lower photovoltaic generation plate and including a thread formed on an outer circumferential surface thereof;

an electric motor that rotates the rotation bar; and an activating member, one end of which is fixed to the forward/backward moving member and the other end of which is coupled to the rotation bar in a ball-screw form, to move the forward/backward moving member in the forward/backward direction while moving along the rotation bar in accordance with rotation of the rotation bar.

10. The hood light-blocking fabric assembly capable of photovoltaic generation of claim 8, wherein the second driving portion includes an electric cylinder unit installed to connect the forward/backward moving member to the upward/downward pivot member, to pivot the upward/downward movable member with respect to the forward/backward moving member by a predetermined angle in accordance with a stretching operation.

11. The hood light-blocking fabric assembly capable of photovoltaic generation of claim 8, further comprising a third driving portion installed to connect the upward/downward moving member to the upper photovoltaic generation plate to rotate the upper photovoltaic generation plate with respect to the upper moving member.

* * * * *